United States Patent
Hwang (10) Patent No.: US 8,314,422 B2
(45) Date of Patent: Nov. 20, 2012

(54) LIGHT EMITTING DEVICE, LIGHT EMITTING DEVICE PACKAGE AND LIGHTING SYSTEM

(75) Inventor: Sung Min Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 44 days.

(21) Appl. No.: 12/945,409

(22) Filed: Nov. 12, 2010

(65) Prior Publication Data

US 2011/0248300 A1    Oct. 13, 2011

(30) Foreign Application Priority Data

Apr. 8, 2010    (KR) .................. 10-2010-0032302

(51) Int. Cl.
*H01L 29/40*    (2006.01)
*H01L 29/88*    (2006.01)

(52) U.S. Cl. .............. 257/46; 257/79; 257/82; 257/111; 257/288; 257/E21.006; 257/E21.053; 257/E21.085; 257/E21.17; 257/E21.126; 257/E21.127; 257/E21.229; 257/E21.361

(58) Field of Classification Search .................. 257/13, 257/46, 79, 82, 88, 111, 173, 199, 200, 201, 257/288, 396, E21.006, E21.053, E21.085, 257/E21.126, E21.127, E21.352, E21.361
See application file for complete search history.

(56) References Cited

U.S. PATENT DOCUMENTS

| | | | |
|---|---|---|---|
| 5,404,370 A * | 4/1995 | Otsubo et al. | 372/45.01 |
| 7,483,464 B2 * | 1/2009 | Kuwata et al. | 372/50.1 |
| 7,808,013 B2 * | 10/2010 | Mendendorp et al. | 257/99 |
| 7,883,910 B2 * | 2/2011 | Tsai et al. | 438/22 |
| 7,995,636 B2 * | 8/2011 | Murakami et al. | 372/50.124 |
| 8,022,386 B2 * | 9/2011 | Yoo | 257/13 |
| 8,106,417 B2 * | 1/2012 | Yoo | 257/99 |
| 2011/0175120 A1 * | 7/2011 | Yoon et al. | 257/94 |
| 2011/0198664 A1 * | 8/2011 | Kang | 257/100 |

FOREIGN PATENT DOCUMENTS

| | | |
|---|---|---|
| JP | 07-249830 | 9/1995 |
| JP | 2010-004005 | 1/2010 |
| KR | 10-0831712 B1 | 5/2008 |
| KR | 10-2009-0048030 A | 5/2009 |
| KR | 2009-0103955 | 10/2009 |
| KR | 2010-0010827 | 2/2010 |

OTHER PUBLICATIONS

Korean Office Action dated Dec. 7, 2010 issued in Application No. 10-2010-0032302.

* cited by examiner

*Primary Examiner* — David Nhu
(74) *Attorney, Agent, or Firm* — KED & Associates LLP (57) ABSTRACT

A light emitting device is provided. The light emitting device includes a light emitting structure including a first conductive semiconductor layer, an active layer, and a second conductive semiconductor layer, a first dielectric layer over a cavity where a part of the light emitting structure is removed, a second electrode layer over the first dielectric layer, a second dielectric layer over the light emitting structure above the cavity, and a first electrode over the second dielectric layer.

16 Claims, 9 Drawing Sheets

LIGHT EMITTING DEVICE, LIGHT EMITTING DEVICE PACKAGE AND LIGHTING SYSTEM

CROSS-REFERENCE TO RELATED APPLICATIONS

The present application claims priority under 35 U.S.C. 119 and 35 U.S.C. 365 to Korean Patent Application No. 10-2010-0032302 (filed on Apr. 8, 2010), which is hereby incorporated by reference in its entirety.

BACKGROUND

The present disclosure relates to a light emitting device, a light emitting device package and a lighting system.

A Light Emitting Diode (LED) is fabricated using a P-N junction diode which has characteristics of converting electric energy to light energy. Herein, the P-N junction diode may be formed by compounding elements of group III and group V of the periodic table. The LED may emit various colors by adjusting a composition ratio of compound semiconductors.

Meanwhile, according to the related art, there is a problem that a current inversely flows when Electrostatic Discharge (ESD) occurs so that an active layer which is a light emitting region is damaged.

For solving this problem, according to the related art, a zener diode is mounted to a package being inversely connected to the LED in parallel for preventing the damage of the LED due to the ESD. Accordingly, the current flows to the LED for emitting light when a constant voltage is supplied, but the current flows to the zener diode when the ESD occurs so that the LED damage due to the ESD may be prevented.

However, according to the related art, since the zener diode is mounted to the package, there is a problem of reducing light absorption.

Further, in a vertical-type LED according to the related art, an N-type electrode and a P-type electrode are formed above and below respectively for injecting the current. Herein, electrons and holes respectively injected by the N-type electrode and the P-type electrode flow to the active layer and combine with each other to generate light. The generated light is emitted to the outside, or it is reflected by the N-type electrode causing an internal loss of the light. That is, according to the related art, since the light emitted under the N-type electrode is reflected by the N-type electrode, efficiency of emitting light is reduced. Moreover, according to the related art, due to resorption of the reflected light, heat is generated.

In addition, according to the related art, a lifetime is shortened and reliability is degraded due to current crowding.

SUMMARY

Embodiments provide a light emitting device, a light emitting device package, and a lighting system capable of preventing damage due to Electrostatic Discharge (ESD) without loss of light absorption.

Embodiments also provide a light emitting device, a light emitting device package, and a lighting system capable of not only increasing efficiency of current spreading but also improving light extraction efficiency.

In one embodiment, a light emitting device includes a light emitting structure including a first conductive semiconductor layer, an active layer, and a second conductive semiconductor layer; a first dielectric layer over a cavity where a part of the light emitting structure is removed; a second electrode layer over the first dielectric layer; a second dielectric layer over the light emitting structure above the cavity; and a first electrode over the second dielectric layer.

In another embodiment, a light emitting device package includes a package body; an electrode layer installed to the package body; and the light emitting device electrically connected to the electrode layer.

In further another embodiment, a lighting system includes a substrate; and a light emitting module provided with the light emitting device package of claim 14 installed on the substrate.

DETAILED DESCRIPTION OF THE EMBODIMENTS

Reference will now be made in detail to the embodiments of the present disclosure, examples of which are illustrated in the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1A:
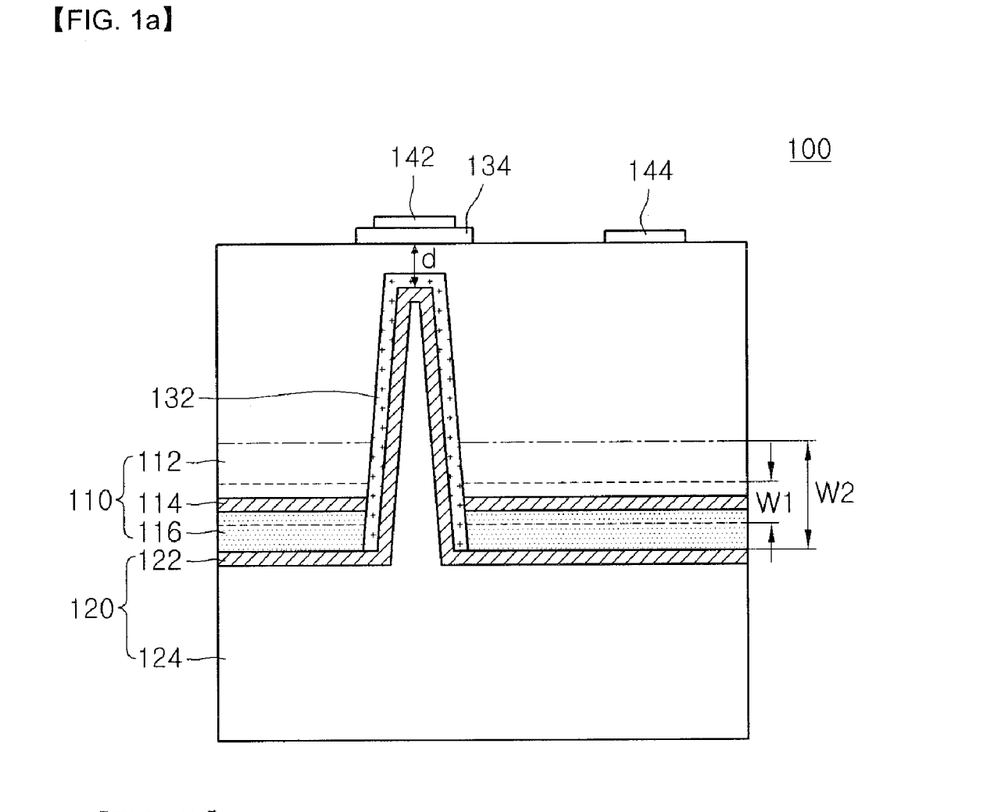
FIG. 1A is a cross-sectional view illustrating a light emitting device according to an embodiment.

FIG. 1A is a cross-sectional view illustrating a light emitting device according to an embodiment.

A light emitting device 100 according to the embodiment may include a light emitting structure 110 including a first conductive semiconductor layer 112, an active layer 114 and a second conductive semiconductor layer 116, a first dielectric layer 132 formed on a cavity A where a portion of the light emitting structure 110 is removed, a second electrode layer 120 formed on the first dielectric layer 132, a second dielectric layer 134 formed on the light emitting structure 110 above the cavity A, and a first electrode 142 formed on the second dielectric layer 134.

The cavity A may be formed removing a portion of a lower part of the light emitting structure 110, but it is not limited to this.

The cavity A may be formed removing the light emitting structure 110 from the second conductive semiconductor layer 116 until a part of the first conductive semiconductor layer 112 is removed.

The second electrode 120 may include a reflection layer 122 formed on the first dielectric layer 132 and a conductive layer 124 formed on the reflection layer 122.

The reflection layer 122 may be formed on at least a part of the cavity.

The first electrode 142 and the part of the cavity may be overlapped spatially.

The second dielectric layer 134 may be formed on the light emitting structure 110, but it is not limited to this.

According to the light emitting device according to the embodiment, the current flows to the active layer 114 when a constant voltage is supplied so that light is generated, and a high frequency may pass through the second dielectric layer 134 and the first dielectric layer 132 when Electrostatic Discharge (ESD) occurs.

In the embodiment, the first conductive semiconductor layer 112, the first dielectric layer 132 and the second electrode 120 may function as a first capacitor C1, and the first electrode 142, the second dielectric layer 134 and the first conductive semiconductor layer 112 may function as a second capacitor C2.

In the embodiment, a distance d between the first dielectric layer 132 and the second dielectric layer 134 may be smaller than a maximum distance to which an electric field induced due to an inverse voltage is transferable.

In FIG. 1A, W1 denotes a depletion distance generated at an equilibrium state (V=0), and W2 denotes the depletion distance generated when the inverse voltage is generated due to the ESD.

When the ESD occurs, a depletion region is extended from W1 to W2 within a Light Emitting Diode (LED). Herein, for the first dielectric layer 132 not to enter the depletion region W2 at the inverse voltage, the distance d should be maintained as smaller than the maximum distance. Therefore, a top area of the first dielectric layer 132 is positioned above the depletion region W2 at the inverse voltage.

A reason for this is that if the first dielectric layer 132 enters the depletion region W2 at the inverse voltage, the function of the first capacitor C1 due to the first dielectric layer 132 is lost so that it is difficult of protect the LED chip when the ESD occurs.

Figure 1B:
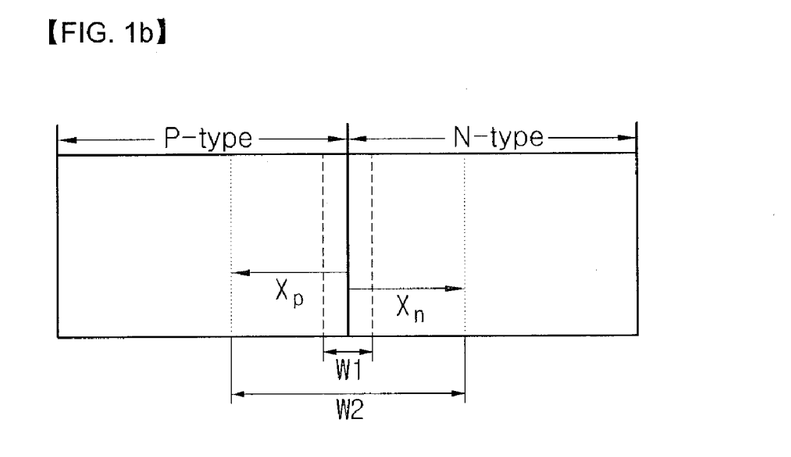
FIG. 1B is an exemplary diagram illustrating a depletion region at a constant voltage and an inverse voltage in the light emitting device according to the embodiment.

FIG. 1B is an exemplary diagram illustrating the depletion region at the constant voltage and the inverse voltage in the light emitting device according to the embodiment.

In FIG. 1B, $x_p$ denotes the depletion distance generated to a P-type region from an interface between the P-type and N-type regions, and $x_n$ denotes the depletion distance generated to the N-type region from the interface between the P-type and N-type regions.

$$x_n = \left[\frac{2\varepsilon_s\varepsilon_0}{q} \frac{N_A}{N_D(N_A+N_D)}(V_{bi}-V_A)\right]^{1/2}$$

$$x_n = \left[\frac{2\varepsilon_s\varepsilon_0}{q} \frac{N_D}{N_A(N_A+N_D)}(V_{bi}-V_A)\right]^{1/2}$$

$\varepsilon_s$ denotes a semiconductor dielectric constant, $\varepsilon_0$ denotes a dielectric constant in the air, $V_{bi}$ denotes a voltage drop loaded on the depletion region at an equilibrium condition, $V_A$ denotes a voltage applied from the outside, $N_A$ denotes a doping density of the P-type region, and $N_D$ denotes the doping density of the N-type region. Herein, W1 denotes the depletion distance generated at the equilibrium state (V=0), and W2 denotes the depletion distance generated when the inverse voltage is generated in the case of the ESD (V<0). The depletion distance W may be expressed as follows.

$$W = x_n + n_p = \left[\frac{2\varepsilon_s\varepsilon_0}{q}\left(\frac{N_A+N_D}{N_AN_D}\right)(V_{bi}-V_A)\right]^{1/2}$$

According to the light emitting device, a method of fabricating the light emitting device and a light emitting device package according to the embodiment, the LED may be prevented from being damaged due to the ESD without loss of light absorption.

According to the embodiment, in the case of the constant voltage, the current flows to the active layer so that the light is emitted by recombination of a carrier; however, in the case of shock of the ESD, energy of the high frequency component passes through a path of the first capacitor and the second capacitor so that the active layer may be protected.

For instance, according to the embodiment, the first dielectric layer is formed at a partial region within the LED chip and the second dielectric layer and the electrode are formed on the first dielectric layer to form the capacitor with the LED. The first capacitor and the second capacitor may be formed in series, but they are not limited to this.

Through this, at a Direct Current (DC) of the constant voltage, the current flows to the light emitting layer, i.e., the active region, so that the light is generated; however, at the ESD shock of a pulse form generated during discharging, the energy of the high frequency component passes through the capacitors so that the light emitting layer may be protected.

Further, according to the embodiment, by forming the capacitor within the LED chip for preventing the electrostatic damage, a cost for fabricating the package may be reduced, a process of the fabricating may be simplified, and the reduction of light absorption may be minimized.

Further, according to the embodiment, by efficient control of the current flow, light extraction efficiency may be increased.

In addition, according to the embodiment, by current spreading, reliability of the light emitting device may be improved.

Figure 2:
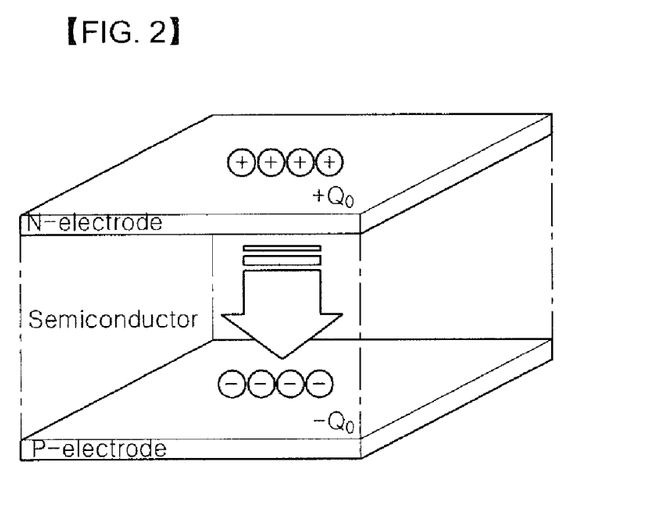
FIGS. 2 and 3 are concept diagrams illustrating formation of an electric field when the Electrostatic Discharge (ESD) occurs in the light emitting device according to the related art.
Figure 3:
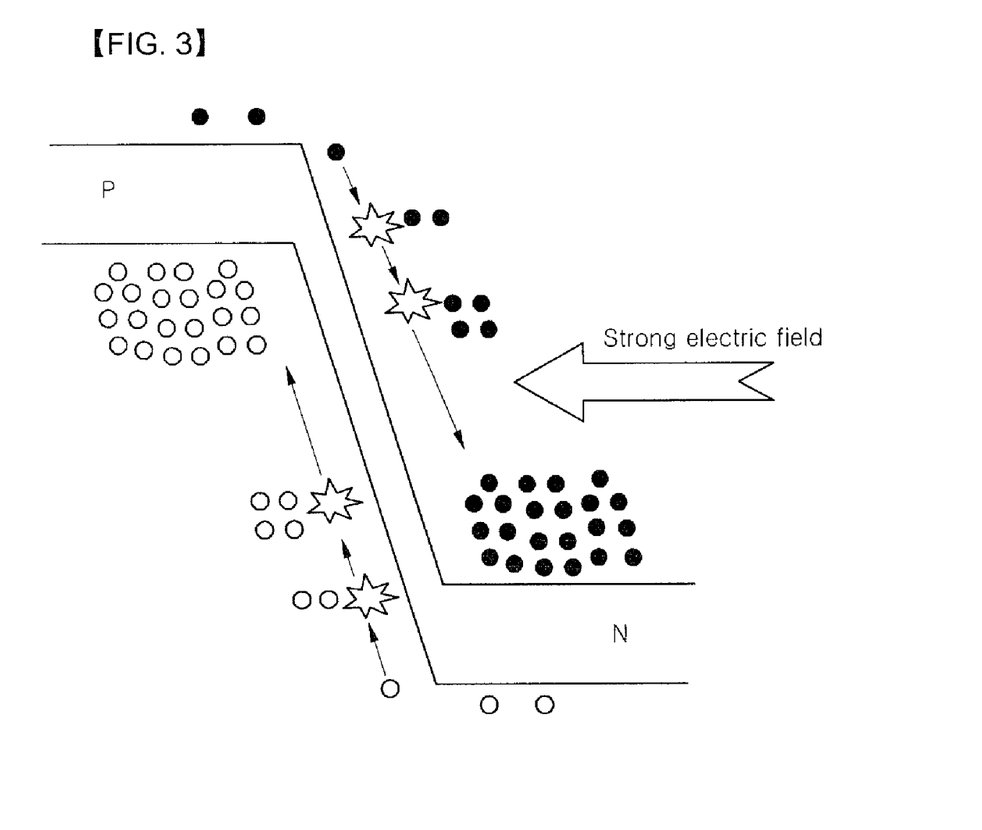
Figure 4:
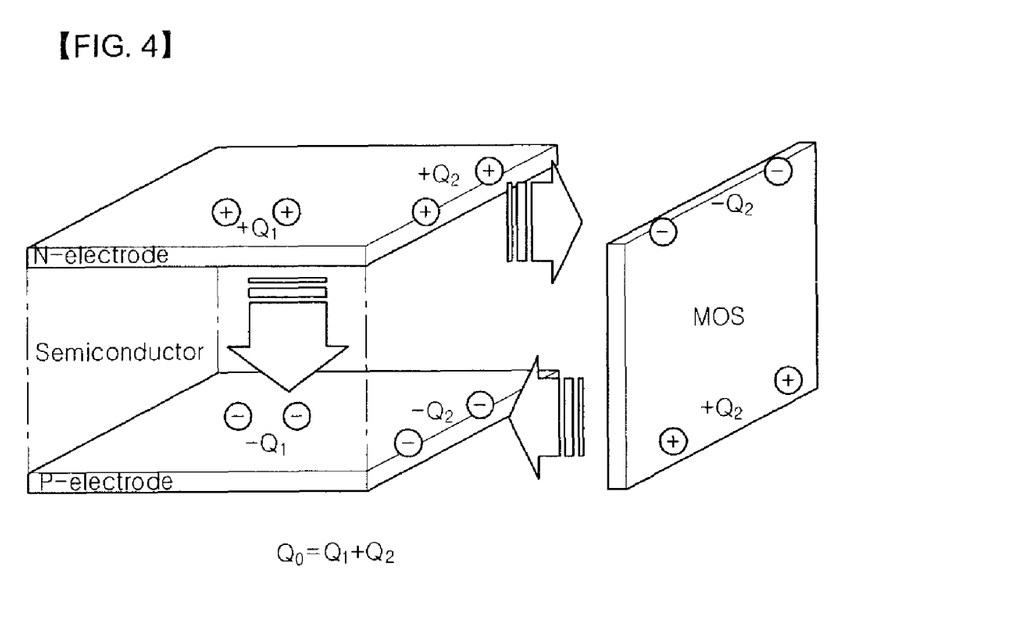
FIG. 4 is a concept diagram illustrating the electric field generated when the ESD occurs in the light emitting device according to the embodiment.

FIGS. 2 and 3 are concept diagrams illustrating formation of the electric field when the ESD occurs in the light emitting device according to the related art. FIG. 4 is a concept diagram illustrating the formation of the electric field when the ESD occurs in the light emitting device according to the embodiment.

Generally, destruction of the LED due to the ESD occurs when the inverse voltage of a semiconductor is generated. As illustrated in FIGS. 2 and 3, due to electric charges generated when the inverse voltage is generated, a strong electric field is induced within the LED active region. And, as illustrated in FIG. 3, carriers (electron and hole) are accelerated and collided with atoms so that other carriers are generated, and the generated carriers also generate lots of carriers. This phenomenon is called an avalanche breakdown. If the strong electric filed is induced due to the electric charges so that the ESD not-endurable for the semiconductor is applied, the LED is eventually destructed due to the avalanche breakdown.

Therefore, as illustrated in FIG. 4, according to the embodiment, a capacitor structure of a form of Metal/Oxide/

Semiconductor (MOS) is inserted so that the electric field loaded to the inside of the LED active layer is partially induced to the MOS, and thus the electric field of the active region is reduced improving a tolerance to the ESD.

That is, according to the related art, all the strong electric field $Q_0$ due to the electric charges is induced to the LED active region so that the LED destruction occurs by the avalanche breakdown. On the contrary, according to the embodiment, a portion $Q_2$ of the electric field $Q_0$ due to the electric charges is induced to the region of the first dielectric layer 132 and the second dielectric layer 134, and thus intensity $Q_1$ of the electric field at the LED active region may be reduced.

Figure 5:
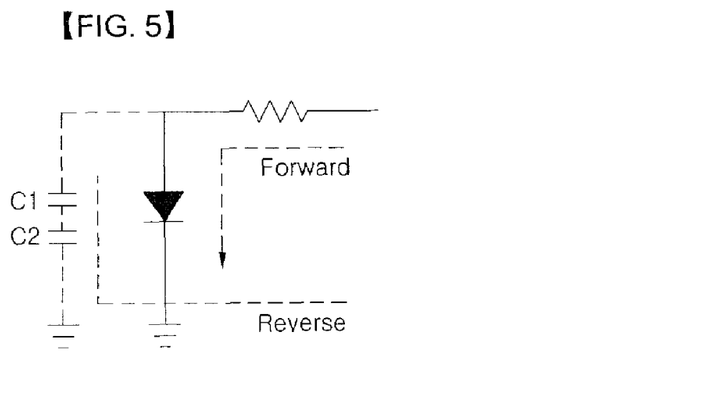
FIG. 5 is an exemplary circuit diagram illustrating the light emitting device according to the embodiment.

FIG. 5 is an exemplary circuit diagram illustrating the light emitting device according to the embodiment.

In the embodiment, the first conductive semiconductor layer 112, the first dielectric layer 132, and the second electrode layer 120 may function as the first capacitor C1, and the first electrode 142, the second dielectric layer 134, and the first conductive semiconductor layer 112 may function as the second capacitor C2.

A circuit for the light emitting device according to the embodiment may be implemented as illustrated in FIG. 5. In the case that the voltage is forward according to the constant voltage, the current flows through the LED to generate the light. In the case that the voltage is reverse according to the ESD, the current flows through the MOS capacitors C1 and C2.

Herein, in the case that the voltage is reverse according to the ESD, the larger a total capacitance $C_{Tot}$ is, the smaller the current flown to the active layer due to the ESD stress is so that the shock may be reduced.

This is expressed as following equations.

$$Q_{Dis} = C_{ESD} V_{ESD}$$

where $Q_{Dis}$ denotes a charge amount during the discharging, $C_{ESD}$ denotes a capacitance during the discharging $$C'_{Tot} = C_{Diode} + C_{MOS} \text{ (with MOS)}$$

$$C_{Tot} = C_{Diode} \text{ (without MOS)}$$

$$I = dQ/dt = \Delta Q/\tau = Q_{Dis}/(RC_{Tot}) \therefore C_{Tot} \uparrow \rightarrow I \downarrow \therefore I' = Q_{Dis}/(RC'_{Tot}) < I = Q_{Dis}/(RC_{Tot}), \because C'_{Tot} > C_{Tot}$$

That is, in the case that the voltage is reverse according to the ESD, the larger the total capacitance $C_{Tot}$ is, the smaller the current (I') flown to the active layer due to the ESD stress is so that the shock may be reduced.

Figure 6:
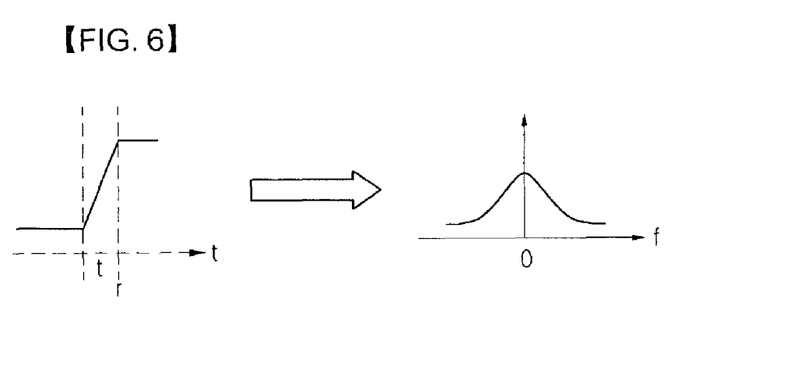
FIG. 6 is a wave diagram illustrating the ESD of the light emitting device according to the embodiment.

FIG. 6 is a wave diagram illustrating the ESD of the light emitting device according to the embodiment.

As illustrated in FIG. 6, a pulse wave has the high frequency component through the Fourier conversion. The steeper a rising time ($t_r$) is, the larger the high frequency component is.

As expressed in following equations, as the frequency becomes higher, impedance (resistance) due to the capacitance becomes smaller. Accordingly, in the case that the voltage is reverse due to the ESD, since the impedance of the MOS capacitor becomes smaller, the high frequency current may flow to the MOS capacitor.

Impedance: $Z = Z_R + jZ_{Im}$ (Zr denotes real impedance, j denotes an imaginary number factor, and $Z_{Im}$ denotes the impedance due to the capacitor)

Capacitor: $Z_{Im,C} = 1/(j\omega C)$ ($\omega = 2\pi f$)

That is, in the case that the voltage is reverse due to the ESD, since the impedance of the MOS capacitor becomes smaller, the high frequency current may flow to the MOS capacitor.

Meanwhile, according to the embodiment, since the cavity region A vertically under the first electrode 142 has no active region 114, the generation of light by recombination of the carriers (electron and hole) may not occur.

Also, according to the embodiment, an etching process for the light emitting structure may be performed from the second conductive semiconductor layer 116 to the part of the first conductive semiconductor layer 112 through the active layer 114. Accordingly, since the first electrode 142 is formed on the cavity thereafter, the light absorption by the first electrode 142 on the cavity may be minimized.

According to the embodiment, by forming the first dielectric layer and the second dielectric layer at the partial region within the LED chip and forming the electrode on it, the capacitor is included with the LED. Through this, at the DC of the constant voltage, the current flows to the light emitting layer, i.e., the active region, so that the light is generated; however, at the ESD shock of the pulse form generated during the discharging, the energy of the high frequency component passes through the dielectric layer of the capacitor so that the light emitting layer may be protected.

Further, according to the embodiment, the first electrode may act as a pad electrode, but it is not limited to this. Accordingly, current crowding just under the pad electrode may be prevented and the current flow near the pad electrode may be smooth so that the reliability of the light emitting device may be improved by the current spreading.

Hereinafter, the method of fabricating the light emitting device will be described according to the embodiment referring to FIGS. 7 to 9. In the embodiment, the light emitting device may be formed with group III-V material such as GaN, GaAs, GaAsP, and GaP, but it is not limited to this.

Figure 7:
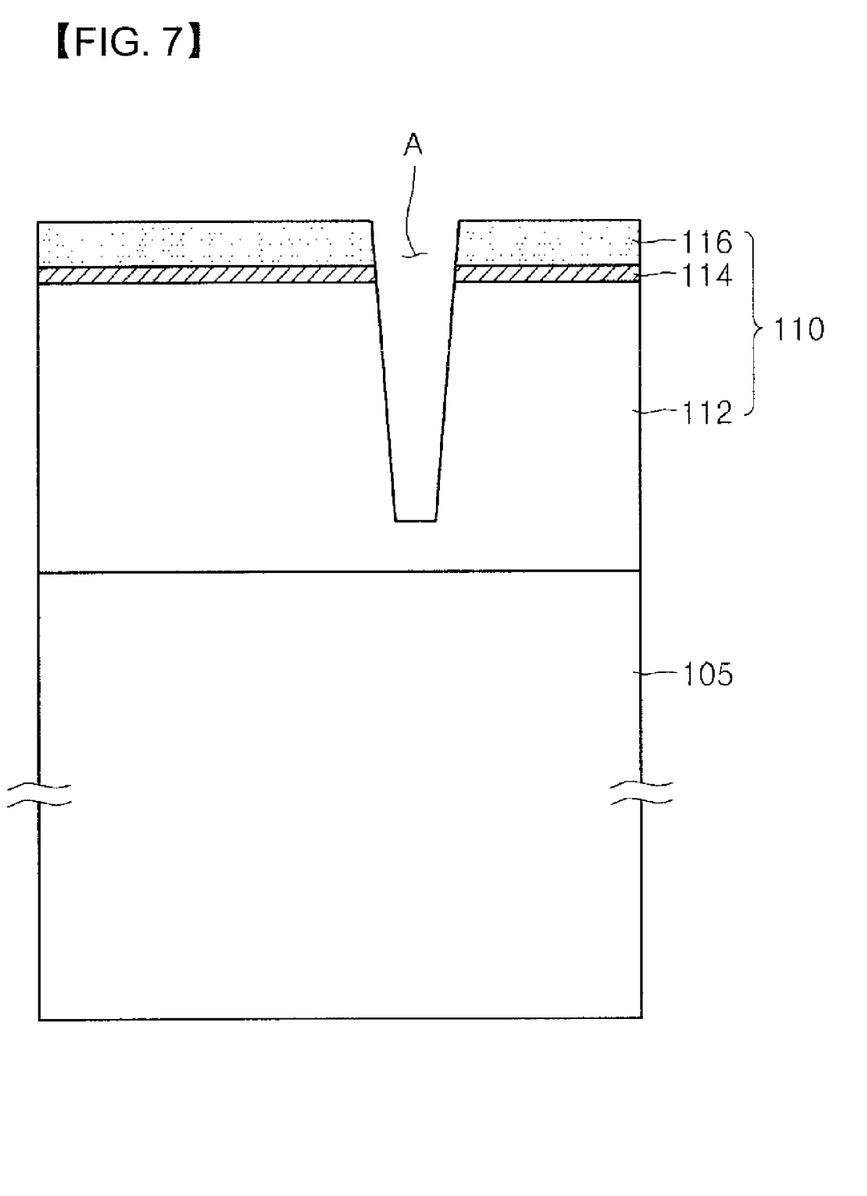
FIGS. 7 to 9 are cross-sectional diagrams illustrating a process of fabricating the light emitting device according to the embodiment.

Firstly, a first substrate 105 is prepared as illustrated in FIG. 7. The first substrate 105 includes a conductive or insulative substrate. For instance, at least one of sapphire ($Al_2O_3$), SiC, Si, GaAs, GaN, ZnO, Si, GaP, InP, Ge, and $Ga_2O_3$ may be used for the first substrate 105. An uneven structure may be formed on the first substrate 105, but it is not limited to this.

A wet washing may be performed to the first substrate 105 for eliminating impurities on its surface.

Thereafter, the light emitting structure 110 including the first conductive semiconductor layer 112, the active layer 114, and the second conductive semiconductor layer 116 is formed on the first substrate 105.

The light emitting structure 110 may be formed using methods of, e.g., Metal Organic Chemical Vapor Deposition (MOCVD), Chemical Vapor Deposition (CVD), Plasma-Enhanced Chemical Vapor Deposition (PECVD), Molecular Beam Epitaxy (MBE), Hydride Vapor Phase Epitaxy, and the like, but it is not limited to this.

A buffer layer (not illustrated) may be formed on the first substrate 105. The buffer layer may reduce lattice mismatching between the materials of the light emitting structure 110 and the first substrate 105. The buffer layer may be formed with the group III-V compound semiconductor, e.g., at least one of GaN, InN, AlN, InGaN, AlGaN, InAlGaN, and AlInN. An undoped semiconductor layer may be formed on the buffer layer, but it is not limited to this.

The first conductive semiconductor layer 112 may be embodied with the group III-V compound semiconductor doped with a first conductive dopant. In the case that the first conductive semiconductor layer 112 is the N-type semiconductor layer, the first conductive dopant may include Si, Ge, Sn, Se, and Te as the N-type dopant; however, it is not limited to this.

The first conductive semiconductor layer 112 may include semiconductor material having a composition equation of $In_xAl_yGa_{1-x-y}N$ ($0 \leq x \leq 1$, $0 \leq y \leq 1$, $0 \leq x+y \leq 1$), but it is not limited to this.

The first conductive semiconductor layer 112 may be formed with one or more of GaN, InN, AlN, InGaN, AlGaN, InAlGaN, AlInN, AlGaAs, InGaAs, AlInGaAs, GaP, AlGaP, InGaP, AlInGaP, InP.

For the first conductive semiconductor layer 112, an N-type GaN layer may be formed by using methods of the CVD, MBE, sputtering, or HVPE. Also, the first conductive semiconductor layer 112 may be formed by injecting silane gas ($SiH_4$) including N-type impurities such as trimethyl gallium gas (TMGa), ammonia gas (NH3), nitrogen gas ($N_2$), and silicon (Si) into a chamber.

The active layer 114 emits the light, which is cause by the meeting between the electrons injected through the first conductive semiconductor layer 112 and the holes injected through the second conductive semiconductor layer 116 formed thereafter, having energy determined by a unique energy band of the active layer (light emitting layer) material.

The active layer may be formed as at least one of a single quantum well structure, a Multi Quantum Well (MQW) structure, a quantum wire structure, and a quantum dot structure. For instance, for the active layer 114, the MQW structure may be formed by injecting the trimethyl gallium (TMGa) gas, the ammonia ($NH_3$) gas, the nitrogen ($N_2$) gas, and the trimethyl indium (TMIn) gas, but it is not limited to this.

A structure of well layer/barrier layer of the active layer 114 may be formed as at least one of paired structures of InGaN/GaN, InGaN/InGaN, GaN/AlGaN, InAlGaN/GaN, GaAs(InGaAss)/AlGaAs, and GaP(InGaP)/AlGaP, but it is not limited to this. The well layer may be formed with material whose band gap is lower than that of the barrier layer.

A conductive clad layer may be formed on or/and under the active layer 114. The conductive clad layer may be formed with an AlGaN-based semiconductor and may have a higher band gap than that of the active layer 114.

The second conductive semiconductor layer 116 may include group III-V compound semiconductor doped with a second conductive dopant, e.g., semiconductor material having the composition equation of $In_xAl_yGa_{1-x-y}N$ ($0 \leq x \leq 1$, $0 \leq y \leq 1$, $0 \leq x+y \leq 1$). The second conductive semiconductor layer 116, e.g., may be selected from GaN, AlN, AlGaN, InGaN, InN, InAlGaN, AlInN, AlGaAs, GaP, GaAs, GaAsP, and AlGaInP. In the case that the second conductive semiconductor layer 116 is the P-type semiconductor layer, the second conductive dopant may include Mg, Zn, Ca, Sr, and Ba as the P-type dopant. The second conductive semiconductor layer 116 may be formed as a single layer or multi layers, but it is not limited to this.

For the second conductive semiconductor layer 116, a P-type GaN layer may be formed by injecting biscetyl cyclopentadienyl magnesium (EtCp2Mg) {Mg(C2H5C5H4)2} including P-type impurities such as the trimethyl gallium (TMGa) gas, the ammonia ($NH_3$) gas, the nitrogen ($N_2$) gas, and magnesium (Mg) into the chamber, but it is not limited thereto.

In the embodiment, the first conductive semiconductor layer 112 and the second conductive semiconductor layer 116 may be respectively embodied as the N-type semiconductor layer and the P-type semiconductor layer, but they are not limited thereto. Further, on the second conductive semiconductor layer 116, a semiconductor layer having an opposite polarity to the second conductive type, e.g., an N-type semiconductor layer (not illustrated), may be further formed in the case that the second conductive semiconductor layer is the P-type semiconductor layer. Accordingly, the light emitting structure 110 may be embodied as one structure among N-P junction, P-N junction, N-P-N junction, and P-N-P junction.

Next, the cavity A is formed by partially eliminating the first conductive semiconductor layer 112, the active layer 114, and the second conductive semiconductor layer 116. The meaning of the cavity A may include a hollow part, a groove, a ditch, a trench, and the like.

For instance, the etching process may be progressed starting from partial second conductive semiconductor layer 116 vertically under the first electrode 142 to be formed later until the first conductive semiconductor layer 112 is exposed. The etching for forming the cavity A may be performed using dry etching or wet etching.

According to the embodiment, the cavity A may also be formed by performing etching from the second conductive semiconductor layer 116 to a part of the first conductive semiconductor layer 112.

According to the embodiment, since the current flow is not smooth at the region where the cavity A is formed, the light is not generated above the cavity A, and thus the light absorption by the first electrode 142 which exists above the cavity A may be minimized. Further, in the embodiment, since the region of the cavity A has no active region 114 vertically under the first electrode 142, the light generation by the recombination of the carriers (electron and hole) may not occur.

Figure 8:
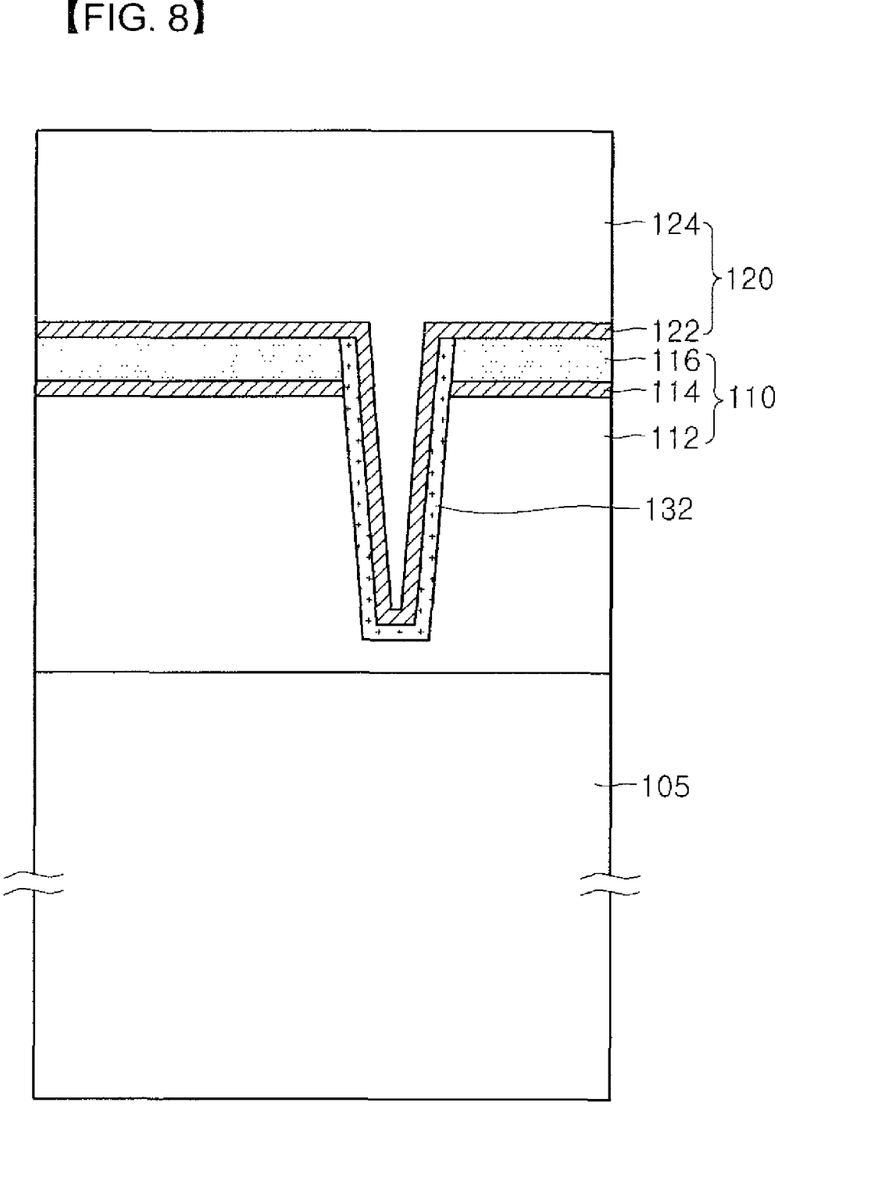

Next, as illustrated in FIG. 8, the first dielectric layer 132 is formed on the cavity A. For instance, the first dielectric layer 132 may be formed on the cavity A.

In the embodiment, the first dielectric layer 132 may also be partially formed at the second conductive semiconductor layer 116 besides a side and a lower surface of the cavity A. Accordingly, the first dielectric layer 132 may be firmly maintained.

Thereafter, the second electrode layer 120 is formed on the second conductive semiconductor layer 116 and the first dielectric layer 132.

The second electrode layer 120 may include an ohmic layer (not illustrated), the reflection layer 122, a junction layer (not illustrated), and the conductive support substrate 124.

For instance, the second electrode layer 120 may include the ohmic layer, and the ohmic layer may be ohmic-contacted to the light emitting structure 110 to smoothly supply power to the light emitting structure 110. The ohmic layer may be formed by multi-layering single metal, metal compound and metal oxide.

For instance, the ohmic layer may be formed including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), ZnO, IrOx, RuOx, NiO, RuOx/ITO, Ni/IrOx/Au, Ni/IrOx/Au/ITO, Ag, Ni, Cr, Ti Al, Rh, Pd, Ir, Ru, Mg, Zn, Pt, Au, and Hf, but it is not limited to such materials.

The second electrode 120 may improve the light extraction efficiency by reflecting incident light from the light emitting structure 110 including the reflection layer 122.

For instance, the reflection layer 122 may be formed with metal or alloy including at least one of Ag, Ni, Al, Rh, Pd, Ir, Ru, Mg, Zn, Pt, Au, and Hf. The reflection layer 122 may also be formed as multi layers by using the metal or alloy and translucent conductive material such as IZO, IZTO, IAZO, IGZO, IGTO, AZO, and ATO. For instance, the reflection layer 122 may be formed as IZO/Ni, AZO/Ag, IZO/Ag/Ni, and AZO/Ag/Ni.

In the case that the second electrode layer 120 includes the junction layer, the reflection layer 122 may also function as the junction layer, or barrier metal or bonding metal may be included. For instance, the junction layer (not illustrated) may include at least one of Ti, Au, Sn, Ni, Cr, Ga, In, Bi, Cu, Ag or Ta.

The second electrode layer 120 may also include the conductive support substrate 124. The conductive support substrate 124 supports the light emitting structure 110 and may provide the power to the light emitting structure 110. The conductive support substrate 124 may be formed with metal, metal alloy, or conductive semiconductor material having excellent electric conductivity.

For instance, the conductive support substrate 124 may include at least one of copper (Cu), copper alloy (Cu alloy), gold (Au), nickel (Ni), molybdenum (Mo), copper-tungsten (Cu—W), and carrier wafer (e.g., Si, Ge, GaAs, GaN, ZnO, SiGe, and SiC).

A thickness of the conductive support substrate 124 may be different according to a design of the light emitting device. For instance, the conductive support substrate 124 may have the thickness of from about 30 μm to about 500 μm.

For forming the conductive support substrate 124, methods of electrochemical metal deposition, plating, or bonding using eutectic metal may be used.

Figure 9:
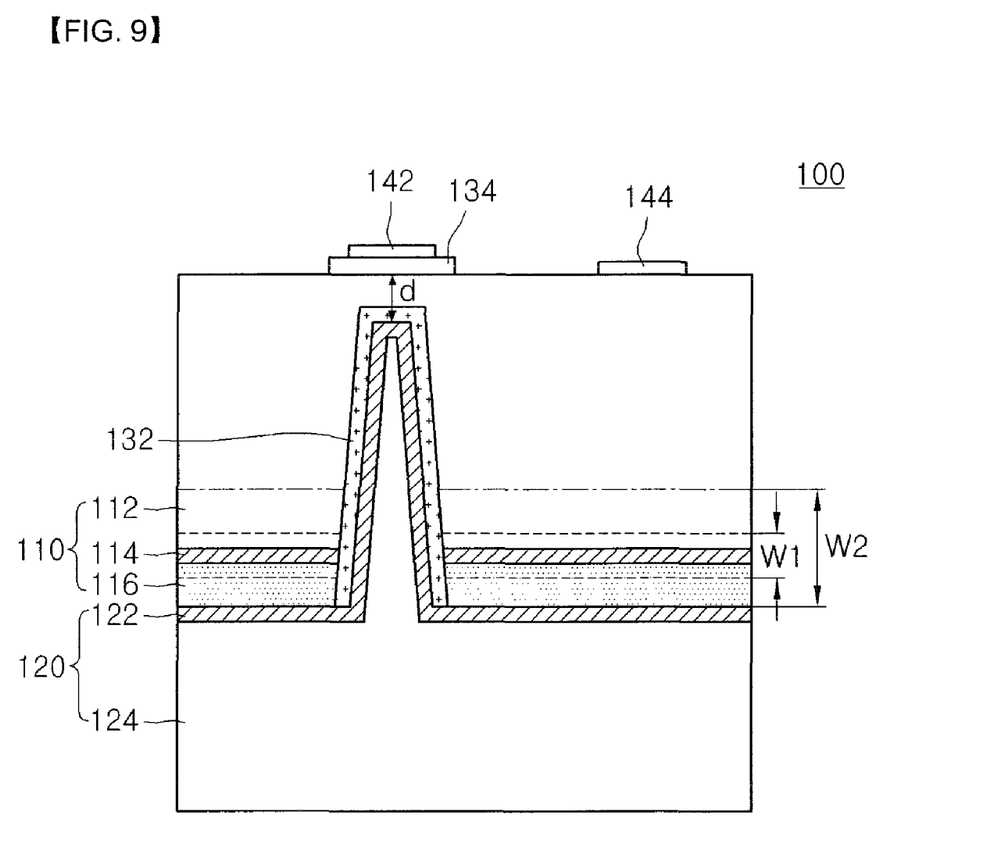

Next, as illustrated in FIG. 9, the first substrate 105 is removed so that the first conductive semiconductor layer 112 is exposed. For removing the first substrate 105, a method of laser lift off or a method of chemical lift off may be used. The first substrate 105 may also be removed by physically grinding it.

Thereafter, on the first conductive semiconductor layer 112 exposed due to the elimination of the first substrate 105, the second dielectric layer 134 is formed. For instance, after forming dielectric material (not illustrated) on an overall surface of the exposed first conductive semiconductor layer 112, the second dielectric layer 134 may be formed by patterning. Or, a pattern (not illustrated) exposing only a region where the second dielectric layer 134 is to be formed may be formed, and then the second dielectric layer 134 may be formed and the pattern may be removed.

Thereafter, the first electrode 142 is formed on the second dielectric layer 134. Meanwhile, the first electrode 142 may be formed on the second dielectric layer 134 to be spatially overlapped by the cavity A. When the first electrode layer 142 is formed, a third electrode 144 may also be formed above the active layer 114. The third electrode 144 may form a state of short-circuit with the first electrode 142.

In the embodiment, since the region of the cavity A has no active region 114 vertically under the first electrode 142, the light generation by the recombination of the carriers (electron and hole) may not occur.

In the embodiment, the current does not flow to the etched region, i.e., the cavity A, because it is covered with the first dielectric layer 132. The current is diffused to other regions. That is, since the cavity A is covered with the first dielectric layer 132, the cavity A acts as a Current Blocking Layer (CBL). Therefore, due to the efficient current flow, reliability is improved and light quantity is increased minimizing the light absorption by the first electrode.

According to the light emitting device, the method of fabricating the light emitting device and the light emitting device package according to the embodiment, the damage due to the ESD may be prevented without loss of light absorption.

That is, according to the embodiment, the dielectric layer is formed at the partial region within the LED chip and the electrode is formed on the dielectric layer to include the capacitor with the LED. Through this, at the Direct Current (DC) of the constant voltage, the current flows to the light emitting layer, i.e., the active region, so that the light is generated; however, at the ESD shock of the pulse form generated during discharging, the energy of the high frequency component passes through the capacitors so that the light emitting layer may be protected.

According to the embodiment, by forming the capacitor within the LED chip for preventing the electrostatic damage, the cost for fabricating the package may be reduced, the process of the fabricating may be simplified, and the reduction of light absorption may be minimized.

Further, according to the embodiment, by the efficient control of the current flow, the light extraction efficiency may be increased. Furthermore, according to the embodiment, by the current spreading, reliability of the light emitting device may be improved.

Figure 10:
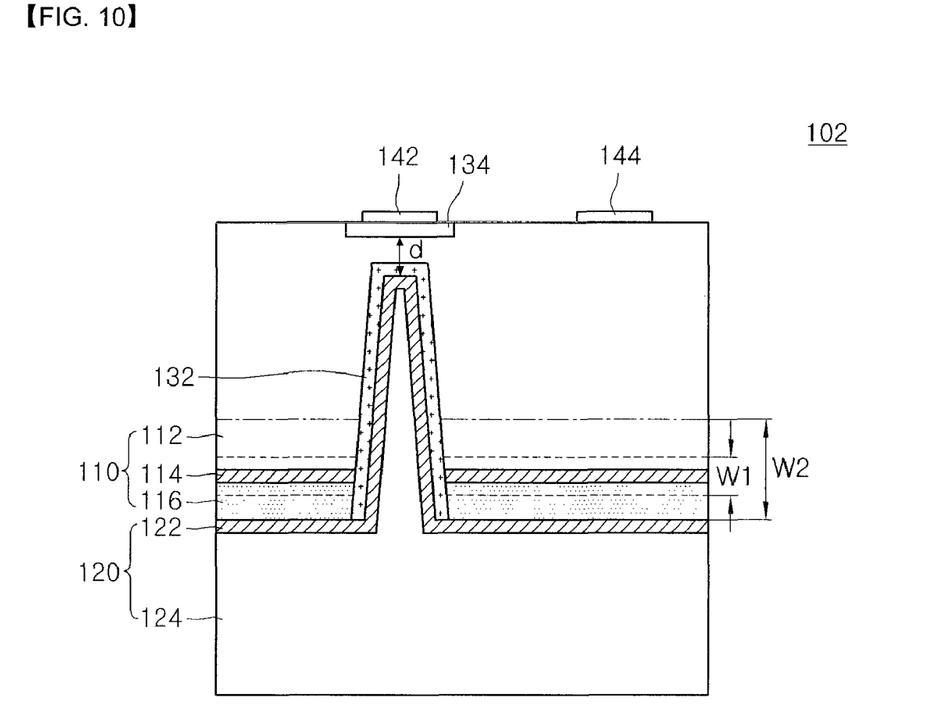
FIG. 10 is a cross-sectional view illustrating a light emitting device according to another embodiment.

FIG. 10 is a cross-sectional view illustrating a light emitting device according to another embodiment.

According to a light emitting device 102 according to the other embodiment, the second dielectric layer 134 may be formed within the light emitting structure. For instance, after a second cavity A2 is formed eliminating a part of the first conductive semiconductor layer 112, the second dielectric layer 134 may be formed to fill the second cavity A2, but it is not limited thereto.

Figure 11:
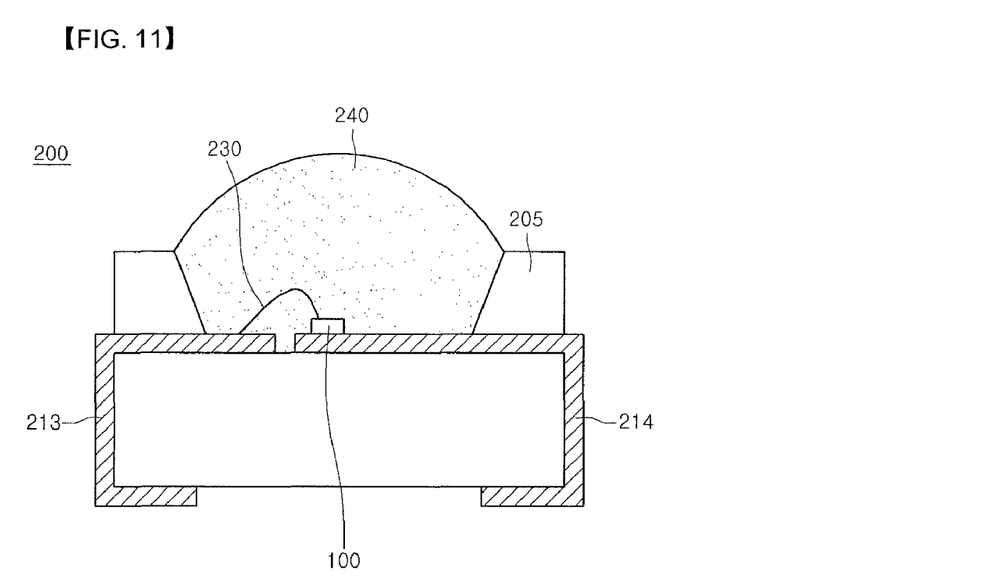
FIG. 11 is a cross-sectional view illustrating a light emitting package according to the embodiment.

FIG. 11 is a diagram illustrating a light emitting device package 200 where the light emitting device according to the embodiment is installed.

Referring to FIG. 11, the light emitting device package according to the embodiment includes a package body unit 205, a third electrode layer 213 and a fourth electrode layer 214 installed to the package body unit 205, a light emitting device 100 installed to the package body unit 205 and electrically connected to the third electrode layer 213 and the fourth electrode layer 214, and a molding member 240 surrounding the light emitting device 100.

The package unit 205 may be formed including silicon material, synthetic resins material, or metal material, and a slope surface may be formed around the light emitting device 100.

The third electrode layer 213 and the fourth electrode layer 214 are electrically separated from each other and serve to provide the power to the light emitting device 100. The third electrode layer 213 and the fourth electrode layer 214 may also serve to increase the light efficiency by reflecting the light generated at the light emitting device 100 and emit heat generated by the light emitting device 100 to the outside.

The vertical-type light emitting device illustrated in FIG. 1 may be adopted for the light emitting device 100, but it is not limited thereto.

The light emitting device 100 may be installed on the package body unit 205 or on the third electrode layer 213 or the fourth electrode layer 214.

The light emitting device 100 may be electrically connected to the third electrode layer 213 and/or the fourth electrode layer 214 in one method of a wire method, a flip chip method, and a die bonding method. In the embodiment, the light emitting device 100 is electrically connected to the third electrode layer 213 through a wire 230 and is electrically and directly contacted to the fourth electrode layer 214.

The molding member 240 may protect the light emitting device 100 by surrounding it. The molding member 240 may include a fluorescent substance so that a wavelength of the light emitted from the light emitting device 100 may be changed.

The light emitting device package may be applied to a lighting system. The lighting system includes a lighting unit illustrated in FIG. 12 and a backlight unit illustrated in FIG. 13 and may also include signal lights, car headlights, signs, and the like.

Figure 12:
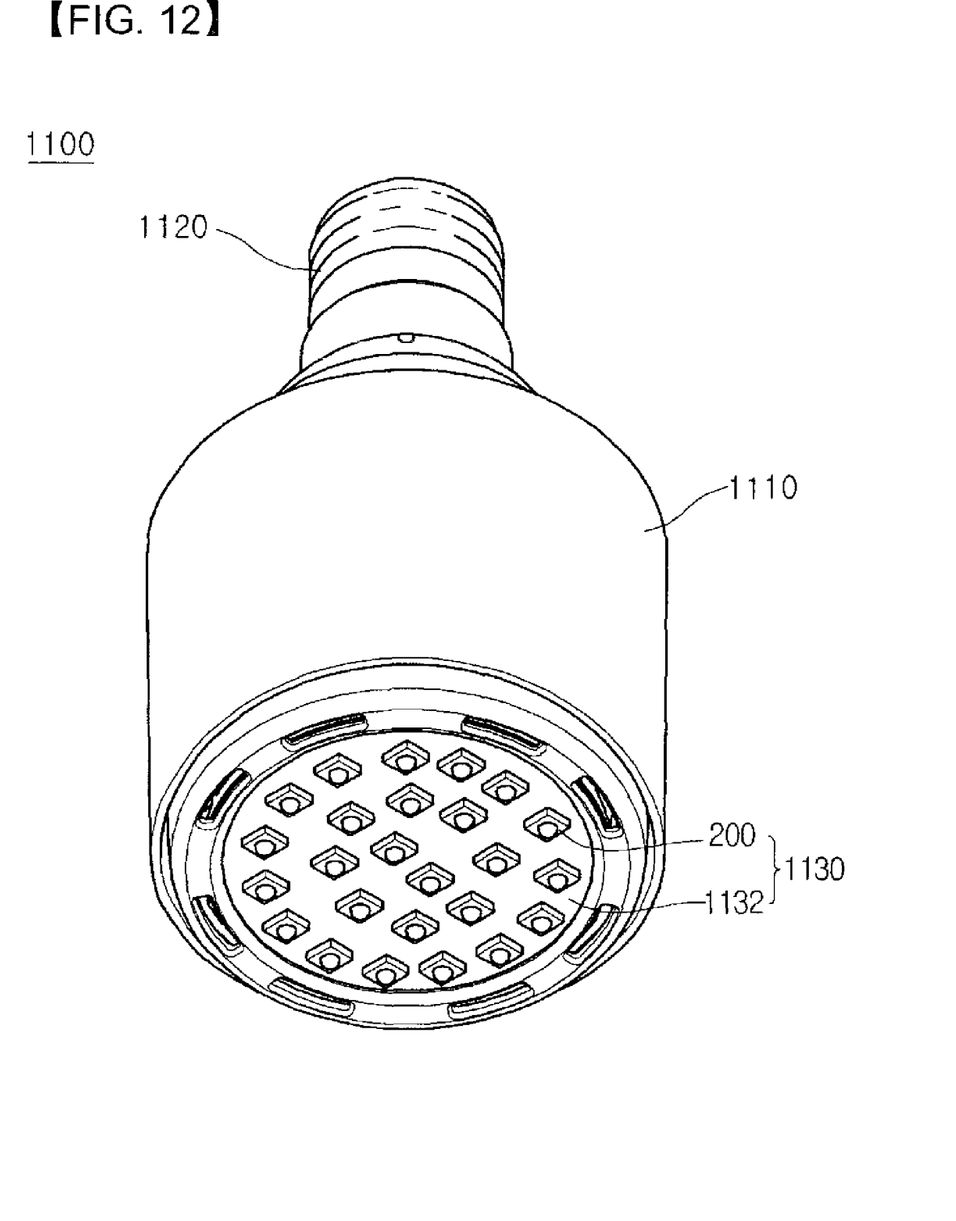
FIG. 12 is a perspective view illustrating a lighting unit according to the embodiment.

FIG. 12 is a perspective view illustrating a lighting unit 1100 according to the embodiment.

Referring to FIG. 12, the lighting unit 1100 may include a case body 1110, a light emitting module 1130 installed to the case body 1110, and a connection terminal 1120 installed to the case body 1110 and provided with power from an external power source.

It is preferable to form the case body 1110 with material which has excellent heat radiation characteristics. For instance, the case body 1110 may be formed with metal material or resin material.

The light emitting module 1130 may include a substrate 1132 and at least one light emitting device package 200 installed to the substrate 1132.

The substrate 1132 may be an insulator where a circuit pattern is printed. For instance, the substrate 1132 may include a typical Printed Circuit Board (PCB), a metal core PCB, a flexible PCB, and a ceramic PCB.

The substrate 1132 may also be formed with material which efficiently reflects light, or its surface may be coated with color, e.g., white and silver, which efficiently reflects light.

At least one light emitting device package 200 may be installed on the substrate 1132. Each light emitting device package 200 may include at least one LED 100. The LED 100 may include a light emitting diode of visible light such as red, green, blue, or white or a UV light emitting diode which emits Ultra Violet (UV).

A combination of various light emitting device packages 200 may be disposed in the light emitting module 1130 for obtaining color tone and brightness. For instance, for securing high Color Rendering Index (CRI), a white light emitting diode, a red light emitting diode, and a green light emitting diode may be combined and disposed.

The connection terminal 1120 may be electrically connected to the light emitting module 1130 to supply power. The connection terminal 1120 is screwed to be connected to the external power source in a socket method; however, there is no limit for this. For instance, the connection terminal 1120 may be formed as a pin shape to be inserted into the external power source or may be connected to the external power source by a wire.

Figure 13:
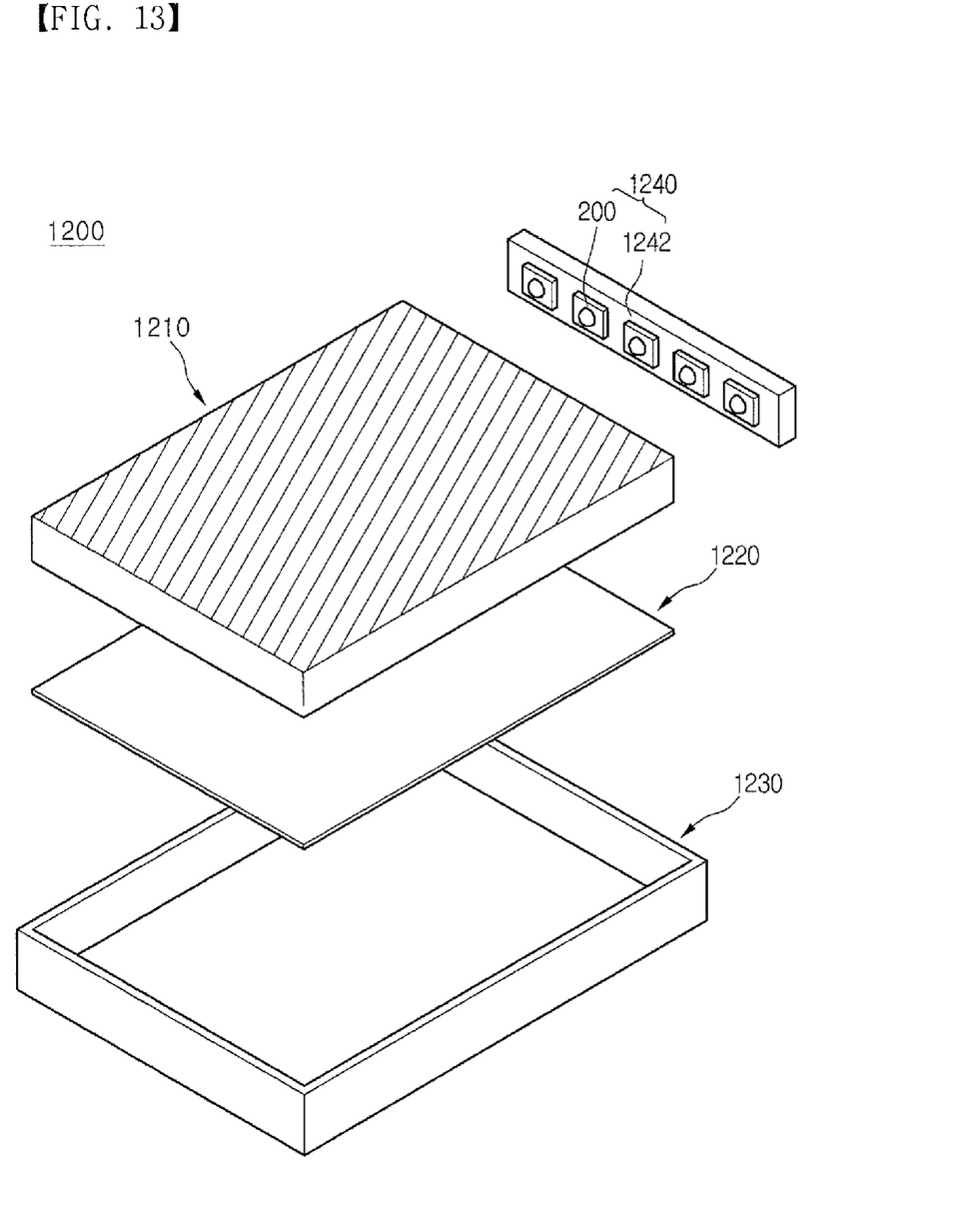
FIG. 13 is an exploded perspective view illustrating a backlight unit according to the embodiment.

FIG. 13 is an exploded perspective view illustrating a backlight unit 1200 according to the embodiment.

The backlight unit 1200 according to the embodiment may include a light guide plate 1210, a light emitting module 1240 providing light to the light guide plate 1210, a reflection member 1220 under the light guide plate 1210, and a bottom cover 1230 storing the light guide plate 1210, the light emitting module 1240, and the reflection member 1220; however, it is not limited thereto.

The light guide plate 1210 serves to diffuse light for convergence to a surface light source. The light guide plate 1210 is formed with transparent material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1240 provides light to at least one side of the light guide plate 1210 and ultimately functions as a light source of a display device where the backlight unit 1200 is installed.

The light emitting module 1240 may be contacted to the light guide 1210, but it is not limited thereto. Specifically, the light emitting module 1240 includes a substrate 1242 and a plurality of light emitting device packages 200 installed to the substrate 1242. Herein, the substrate 1242 may be contacted to the light guide plate 1210, but it is not limited thereto.

The substrate 1242 may be the PCB including a circuit pattern (not illustrated). However, the substrate 1242 may include not only the typical PCB but also the metal core PCB (MCPCB) and the flexible PCB (FPCB), and it is not limited thereto.

The plurality of light emitting device packages 200 may be installed on the substrate 1242 so that a light-emitting surface is separated from the light guide plate 1210 by a predetermined distance.

The reflection member 1220 may be formed under the light guide plate 1210. The reflection member 1220 reflects the light incident to the lower surface of the light guide plate 1210 in an upward direction so that brightness of the backlight unit 1200 may be improved. The reflection member 1220 may be formed with, e.g., PET, PC, and PVC resins; however, it is not limited thereto.

The bottom cover 1230 may store the light guide plate 1210, the light emitting module 1240, and the reflection member 1220. To this end, the bottom cover 1230 may be formed as a boxlike whose upper surface is open, and there is no limit for this.

The bottom cover 1230 may be formed with metal material or resin material and may be fabricated using processes of press or extrusion molding.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device (LED), comprising:
    a light emitting structure comprising a first conductive semiconductor layer, an active layer, and a second conductive semiconductor layer;
    a first dielectric layer over a cavity where a part of the light emitting structure is removed;
    a second electrode layer over the first dielectric layer;
    a second dielectric layer over the light emitting structure above the cavity; and
    a first electrode over the second dielectric layer.

2. The light emitting device according to claim 1, wherein the cavity is formed by partially removing a lower part of the light emitting structure.

3. The light emitting device according to claim 1, wherein the cavity is formed by removing from the second conductive semiconductor layer to a part of the first conductive semiconductor layer.

4. The light emitting device according to claim 1, wherein the second electrode comprises:
    a reflection layer over the first dielectric layer; and
    a conductive layer over the reflection layer.

5. The light emitting device according to claim 4, wherein the reflection layer is formed at a part of the cavity at least.

6. The light emitting device according to claim 1, wherein the first electrode and a part of the cavity are spatially overlapped.

7. The light emitting device according to claim 1, wherein a current flows to the active layer to generate light at a constant voltage, and a high frequency passes through the second dielectric layer and the first dielectric layer when Electrostatic Discharge (ESD) occurs.

8. The light emitting device according to claim 1, wherein the first conductive semiconductor layer, the first dielectric layer, and the second electrode layer function as a first capacitor.

9. The light emitting device according to claim 8, wherein the first electrode, the second dielectric layer, and the first conductive semiconductor layer function as a second capacitor.

10. The light emitting device according to claim 9, wherein a distance between the first dielectric layer and the second dielectric layer is lower than a maximum distance to which an electric field induced due to an inverse voltage is transferable from the second capacitor to the first capacitor.

11. The light emitting device according to claim 1, wherein a top area of the first dielectric layer is positioned above a depletion region at an inverse voltage.

12. The light emitting device according to claim 9, wherein a current flows to the active layer to emit light by recombination of carriers in the case of a constant voltage, and energy of a high frequency component passes through a path of the first capacitor and the second capacitor to protect the active layer in the case of occurrence of ESD.

13. The light emitting device according to claim 1, wherein the second dielectric layer is formed above the light emitting structure.

14. The light emitting device according to claim 1, wherein the second dielectric layer is formed within the light emitting structure.

15. A light emitting device (LED) package, comprising:
    a package body;
    an electrode layer installed to the package body; and
    a light emitting device of claim 1 electrically connected to the electrode layer.

16. A lighting system, comprising:
    a substrate; and
    a light emitting module provided with a light emitting device package of claim 15 installed on the substrate.

* * * * *